United States Patent
Liu et al.

(10) Patent No.: US 9,844,131 B2
(45) Date of Patent: Dec. 12, 2017

(54) RIGID-FLEX CIRCUIT BOARD AND MANUFACTURING METHOD THEREOF

(71) Applicant: UNIFLEX Technology Inc., Taichung (TW)

(72) Inventors: Yi-Chun Liu, New Taipei (TW); Chiu-Pei Huang, Taichung (TW); Pei-Hao Hung, Taichung (TW); Yuan-Chih Lee, Taoyuan (TW)

(73) Assignee: UNIFLEX Technology Inc., Taichung (TW)

( * ) Notice: Subject to any disclaimer, the term of this patent is extended or adjusted under 35 U.S.C. 154(b) by 0 days.

(21) Appl. No.: 15/284,510

(22) Filed: Oct. 3, 2016

(65) Prior Publication Data
US 2017/0156205 A1  Jun. 1, 2017

(30) Foreign Application Priority Data
Dec. 1, 2015 (TW) .............. 104140219 A

(51) Int. Cl.
| | |
|---|---|
| H05K 1/02 | (2006.01) |
| H05K 1/11 | (2006.01) |
| H05K 3/42 | (2006.01) |
| H05K 3/06 | (2006.01) |
| H05K 3/46 | (2006.01) |

(52) U.S. Cl.
CPC .......... *H05K 1/0278* (2013.01); *H05K 1/115* (2013.01); *H05K 3/064* (2013.01); *H05K 3/421* (2013.01); *H05K 3/423* (2013.01); *H05K 3/429* (2013.01); *H05K 3/4652* (2013.01); *H05K 3/4664* (2013.01); *H05K 2201/09509* (2013.01); *H05K 2201/09545* (2013.01); *H05K 2203/0502* (2013.01)

(58) Field of Classification Search
CPC .... H05K 1/0277; H05K 1/0278; H05K 1/028; H05K 1/0281; H05K 1/0283
See application file for complete search history.

(56) References Cited

FOREIGN PATENT DOCUMENTS

| | | |
|---|---|---|
| CN | 103974559 | 8/2014 |
| TW | 200924573 | 6/2009 |
| TW | 201349956 | 12/2013 |
| TW | 201431447 | 8/2014 |
| TW | 201540124 | 10/2015 |
| TW | M521864 | 5/2016 |

OTHER PUBLICATIONS

"Office Action of Taiwan Counterpart Application", dated Sep. 6, 2016, p. 1-p. 4, in which the listed references were cited.

*Primary Examiner* — Jeremy C Norris
(74) *Attorney, Agent, or Firm* — JCIPRNET

(57) ABSTRACT

A rigid-flex circuit board includes a flexible circuit board, a plurality of patterned photo-imageable substrates and a plurality of patterned circuit layers. The flexible circuit board includes a plurality of exposed regions, a top surface and a bottom surface opposite to the top surface. The exposed regions are respectively located at the top surface and the bottom surface. The patterned photo-imageable substrates are disposed on the top surface and the bottom surface respectively. Each patterned photo-imageable substrate includes an opening exposing the corresponding exposed region. Each patterned photo-imageable substrate includes photo-sensitive material. The patterned circuit layers are disposed on the patterned photo-imageable substrates respectively and expose the exposed regions. A manufacturing method of the rigid-flex circuit board is also provided.

21 Claims, 7 Drawing Sheets

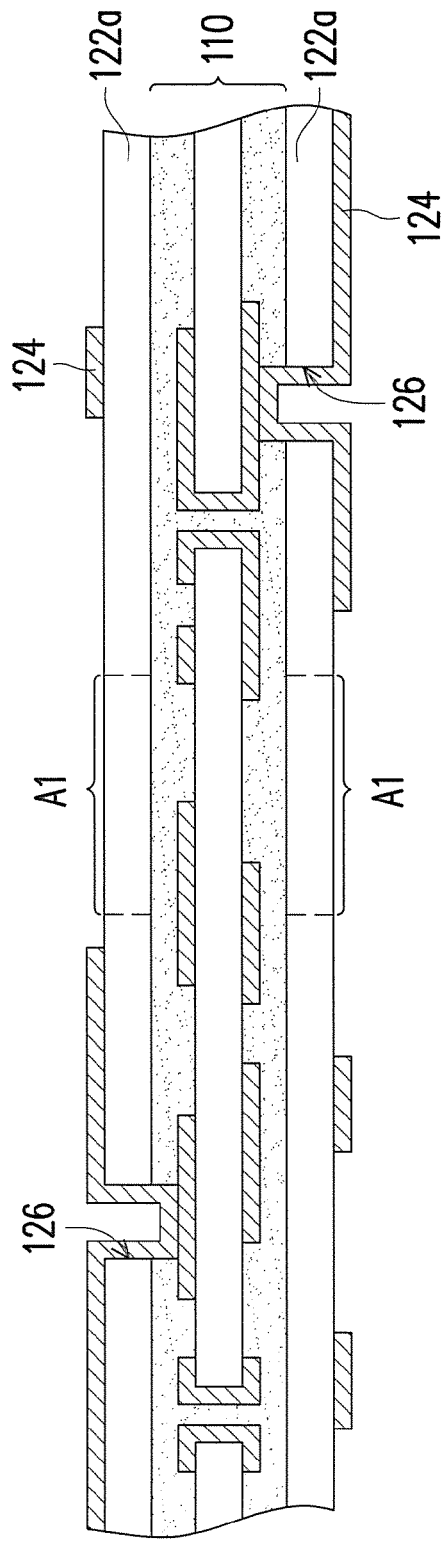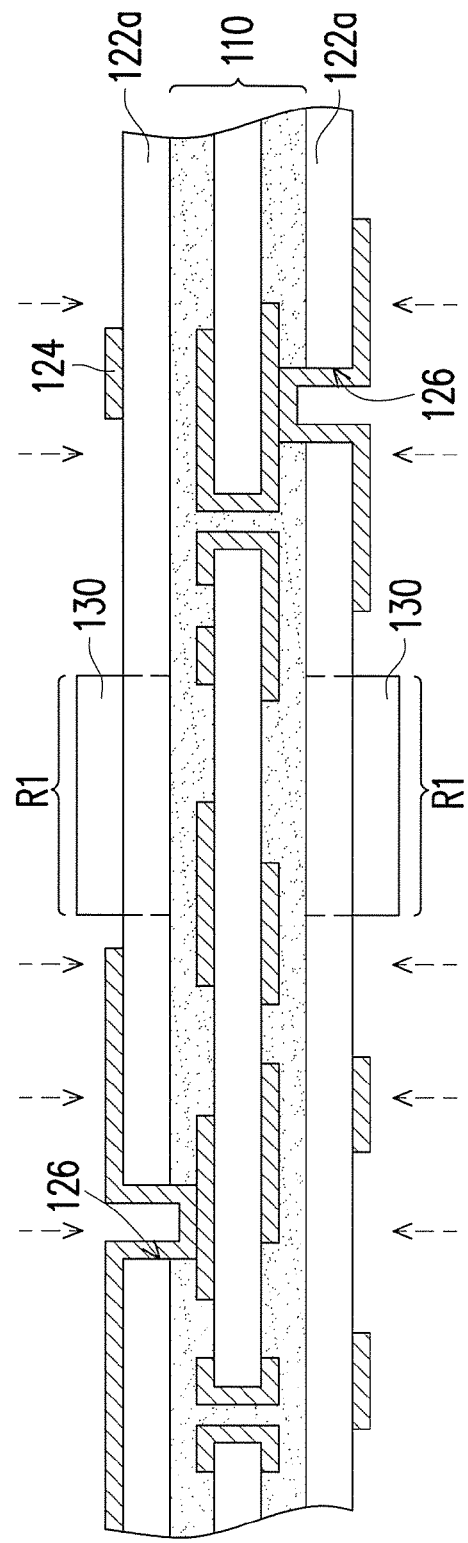

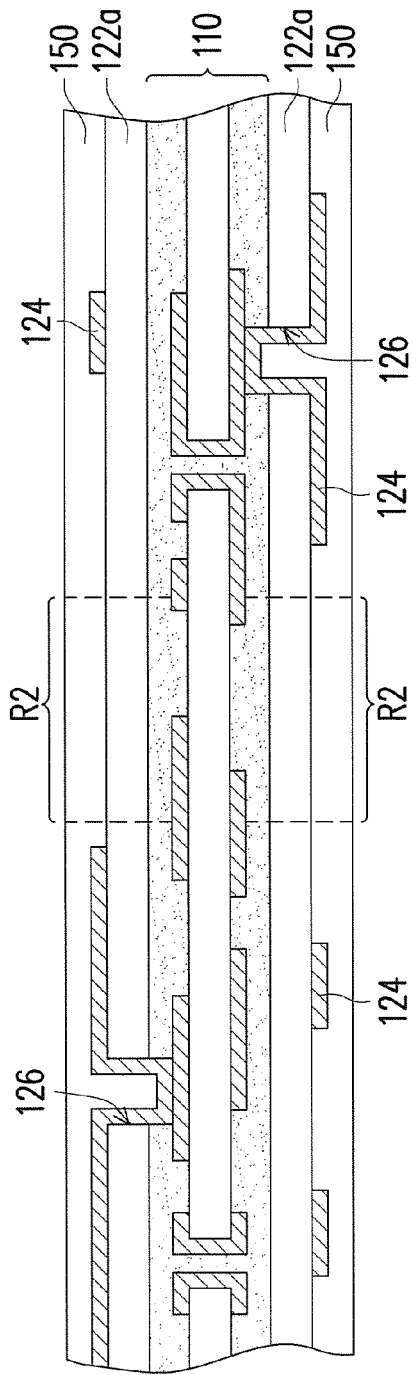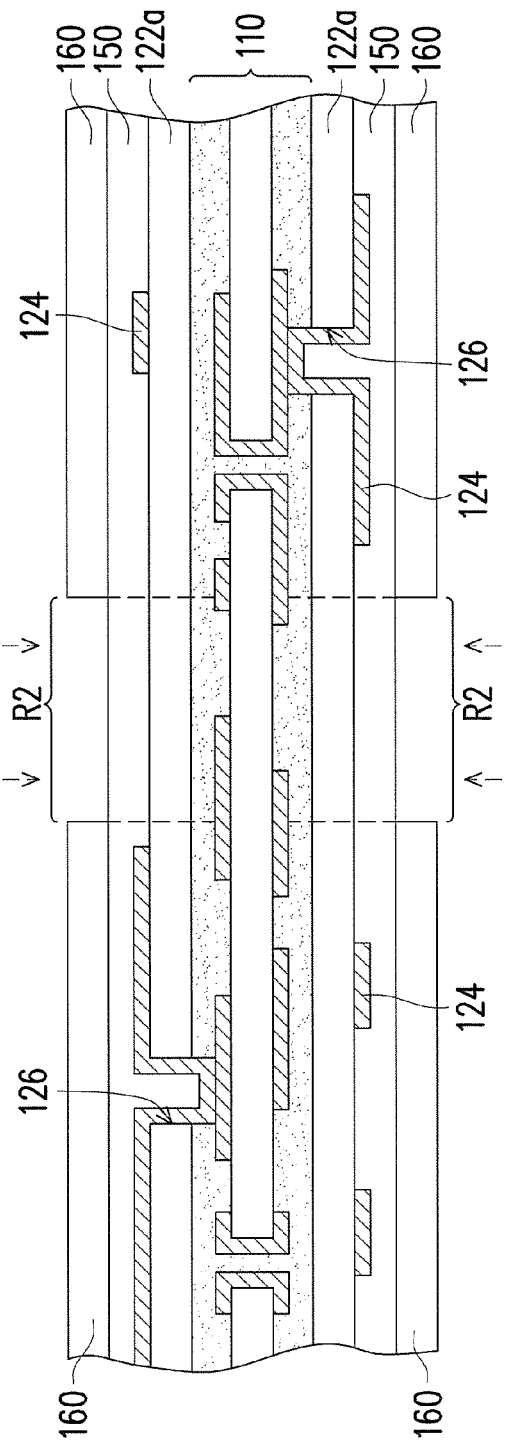

US 9,844,131 B2

RIGID-FLEX CIRCUIT BOARD AND MANUFACTURING METHOD THEREOF

CROSS-REFERENCE TO RELATED APPLICATION

This application claims the priority benefit of Taiwan application serial no. 104140219, filed on Dec. 1, 2015. The entirety of the above-mentioned patent application is hereby incorporated by reference herein and made a part of this specification.

BACKGROUND OF THE INVENTION

Field of the Invention

The present invention generally relates to a circuit board and a manufacturing method thereof. More particularly, the present invention relates to a rigid-flex circuit board and a manufacturing method thereof.

Description of Related Art

Circuit boards include rigid printed circuit boards (short for rigid PCBs), a flexible printed circuit boards (short for FPC boards) and rigid and flexible circuit board (short for rigid-flex circuit board), which are categorized by rigid or flexible characteristics of the dielectric layers thereof. In general, rigid-flex circuit boards are printed circuit boards composed of FPC boards and rigid PCBs, such that the rigid-flex circuit boards can have both the flexibility of the FPC boards and the structural strength of the rigid PCBs. Under the circumstances that inner space of electronic products is rapidly reduced, rigid-flex circuit boards provide maximum flexibility in component connection and assembling space, so rigid-flex circuit boards are often adopted in electronic products as carriers for components.

In manufacturing process, a FPC board having circuit thereon is firstly adopted as a core layer of a rigid-flex circuit board. Then, a cavity is formed on a rigid PCB by routing process. Next, two rigid PCBs are laminated onto two opposite surfaces of the FPC board, such that the cavity of the rigid PCB exposes an exposed region of the FPC board to form the rigid-flex circuit board. However, the routing process has rather low production efficiency and high production cost. Moreover, the process of forming the cavity by routing process would produce scraps, which may cause damages to the FPC board when the rigid PCBs are laminated onto the FPC board. In addition, during the process of laminating the rigid PCBs onto the FPC board, a prepreg of the rigid PCB is easily deformed by compression, such that a part of the prepreg overflows into the cavity and covers the exposed region of the FPC board. As such, the flexibility of the FPC board is significantly reduced since the exposed region is covered by the prepreg. Furthermore, during the process of lamination, the prepreg covering the exposed region is hard to remove and easily causes the problem of gel overflow. Moreover, the process of laminating the rigid PCBs onto the FPC board easily causes misalignment, which effects yield rates of sequential manufacturing process.

SUMMARY OF THE INVENTION

Accordingly, the present invention is directed to a rigid-flex circuit board and a manufacturing method thereof, which effectively improve efficiency and yield rate of the manufacturing process.

The present invention provides a rigid-flex circuit board including a flexible circuit board, a plurality of patterned photo-imageable substrates and a plurality of patterned circuit layers. The flexible circuit board includes a plurality of exposed regions, a top surface and a bottom surface opposite to the top surface. The exposed regions are respectively located at the top surface and the bottom surface. The patterned photo-imageable substrates are disposed on the top surface and the bottom surface respectively. Each of the patterned photo-imageable substrates includes an opening exposing the corresponding exposed region, and each of the patterned photo-imageable substrates includes photo-sensitive material. The patterned circuit layers are disposed on the patterned photo-imageable substrates respectively and expose the exposed regions.

The present invention provides a manufacturing method of a rigid-flex circuit board including the following steps. Firstly, a flexible circuit board is provided, wherein the flexible circuit board includes a plurality of exposed regions, a top surface and a bottom surface opposite to the top surface, and the exposed regions are respectively located at the top surface and the bottom surface. A stacking layer is disposed on each of the top surface and the bottom surface of the flexible substrate, wherein each of the stacking layers includes a photo-imageable substrate and a metal layer. Each of the photo-imageable substrates is located between the flexible substrate and the corresponding metal layer, and each of the photo-imageable substrate comprises photo-sensitive material. A patterning process is performed to the metal layers to form a plurality of patterned circuit layers, and the patterned circuit layers expose the exposed regions respectively. A photolithography process is performed to the photo-imageable substrates to form a plurality of patterned substrates. Each of the patterned substrates includes an opening, and the openings expose the exposed regions respectively.

According to an embodiment of the present invention, the flexible circuit board includes a flexible substrate and a patterned metal layer, and the patterned metal layer is disposed on two opposite surfaces of the flexible substrate.

According to an embodiment of the present invention, the flexible circuit board further includes a plurality of first conductive vias disposed on the flexible substrate. The first conductive vias are electrically connected to the patterned metal layer and electrically connected to the two opposite surfaces of the flexible substrate.

According to an embodiment of the present invention, each of the first conductive vias includes a plated through hole, a blind via hole or a buried via hole.

According to an embodiment of the present invention, each of the patterned photo-imageable substrates further includes a plurality of second conductive vias, and the second conductive vias are electrically connected to the patterned circuit layer and the patterned metal layer.

According to an embodiment of the present invention, each of the second conductive vias includes a plated through hole, a blind via hole or a buried via hole.

According to an embodiment of the present invention, the flexible circuit layer further includes a coverlay covering the flexible substrate and the patterned metal layer.

According to an embodiment of the present invention, the rigid-flex circuit board further includes a plurality of photo-imageable solder resist layers disposed on the corresponding patterned circuit layers and the corresponding patterned photo-imageable substrates, wherein each of the photo-imageable solder resist layers includes a solder resist opening, and an inner wall of each of the solder resist openings is aligned with an inner wall of each of the openings.

According to an embodiment of the present invention, the step of providing the flexible circuit layer includes the following steps. A flexible substrate is provided. A metal foil layer is laminated on each of the two opposite surfaces of the flexible substrate. A plurality of first openings are formed on the flexible substrate, wherein each of the first openings connects the two opposite surfaces of the flexible substrate. An electroplating process is performed to form a metal plated layer, wherein the metal plated layer covers the two opposite surfaces of the flexible substrate and inner walls of the first openings to form a plurality of first conductive vias. An etching process is preformed to the metal plated layer to from the patterned metal layer.

According to an embodiment of the present invention, the patterning process includes the following steps. A patterned dry film is formed on each of the metal layers, wherein each of the patterned dry films partially exposes each of the metal layers. An etching process is performed to remove a part of the metal layers exposed by the patterned fry films to form the patterned circuit layers.

According to an embodiment of the present invention, the photolithography process includes: A patterned dry film is formed on each of the photo-imageable substrates, wherein each of the patterned dry films covers a removing region of each of the photo-imageable substrates, and each of the removing regions is an orthogonal-projection region where each of the exposed regions is orthogonally projected on the corresponding photo-imageable substrate. An exposure process is performed, so as to expose a part of the photo-imageable substrates uncovered by the patterned dry films under light. A development process is performed, so as to remove the removing regions covered by the patterned dry films to form the patterned substrate having the openings.

According to an embodiment of the present invention, the photolithography process includes the following steps. An exposure process is performed to a removing region of each of the photo-imageable substrate, wherein each of the removing regions is an orthogonal-projection region where each of the exposed regions is orthogonally projected on the corresponding photo-imageable substrate. A development process is performed, so as to remove the removing regions to from the patterned substrate having the openings.

According to an embodiment of the present invention, the manufacturing method of the rigid-flex circuit board further including the following steps. A plurality of photo-imageable solder resist layers are formed, the photo-imageable solder resist layers cover the patterned circuit layers and the photo-imageable substrates. An exposure process is performed to a plurality of removing regions of the photo-imageable substrates and the photo-imageable solder resist layers, wherein each of the removing regions is an orthogonal-projection region where each of the exposed regions is orthogonally projected on the corresponding photo-imageable substrate and the corresponding photo-imageable solder resist layer. A development process is performed, so as to remove the removing regions to form a plurality of patterned photo-imageable solder resist layers and the patterned substrates.

According to an embodiment of the present invention, each of the photo-imageable solder resist layers includes a liquid photo-imageable (LPI) solder resist layer to expose the exposed regions and at least a part of the patterned circuit layers.

According to an embodiment of the present invention, a method for manufacturing the stacking layer includes the following steps. An opening photolithograph process is performed on each of the photo-imageable substrates to form a plurality of second openings on each of the photo-imageable substrates. An electroplating process is performed to form the metal layers on the photo-imageable substrates, and the metal layers covers inner walls of the second openings to form a plurality of second conductive vias.

According to an embodiment of the present invention, the manufacturing method of the rigid-flex circuit board further includes the following steps. A plurality of alignment holes are formed on the stacking layers, wherein the alignment holes are located on a periphery of the stacking layers.

In light of the foregoing, in the present invention, the rigid-flex circuit board and the manufacturing method thereof firstly employs the photo-imageable substrate to cover the flexible circuit board; then, a photolithography process is performed on a removing region of the photo-imageable substrates by utilizing the photo-imageable characteristics of the photo-imageable substrates to remove the removing region and expose the flexible circuit board underneath, so as to form the structure of the rigid-flex circuit board easily. Therefore, the present invention improves the manufacturing efficiency of the rigid-flex circuit board. Moreover, the present invention avoids the damage to the flexible circuit board caused by scraps produced from conventional manufacturing process, and further avoids the problems of gel overflow and misalignment during lamination process. Therefore, the present invention also can improve yield rate of manufacturing process of the rigid-flex circuit board.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1K are flow charts in cross-sectional view of a manufacturing method of a rigid-flex circuit board according to an embodiment of the present invention.

FIG. 3A to FIG. 3C are a part of the flow charts in cross-sectional view of a manufacturing method of a rigid-flex circuit board according to another embodiment of the present invention.

DESCRIPTION OF THE EMBODIMENTS

The present invention will now be described more fully with reference to the accompanying drawings, in which exemplary embodiments of the invention are shown. The terms used herein such as "above", "below", "front", "back", "left" and "right" are for the purpose of describing directions in the figures only and are not intended to be limiting of the invention. Moreover, in the following embodiments, the same or similar reference numbers denote the same or like components.

Figure 1A:
Figure 1B:
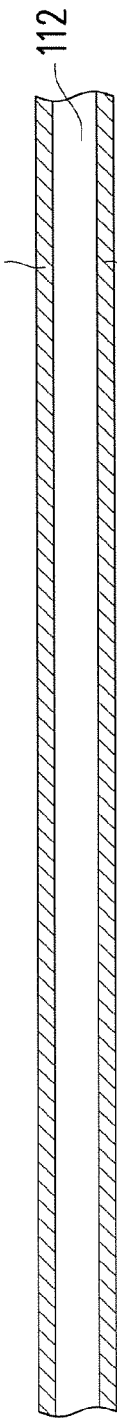
Figure 1C:
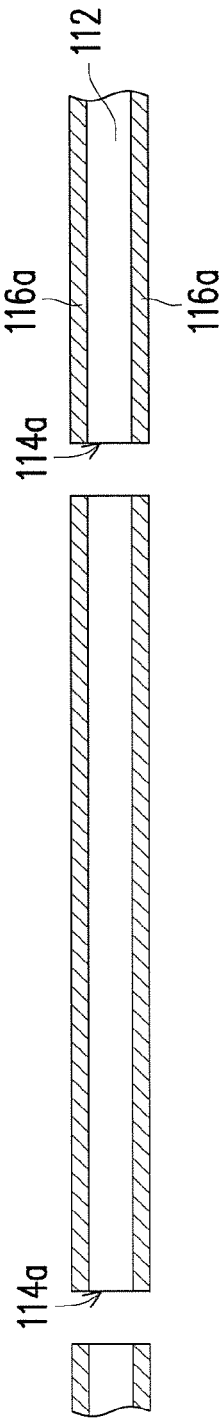
Figure 1D:
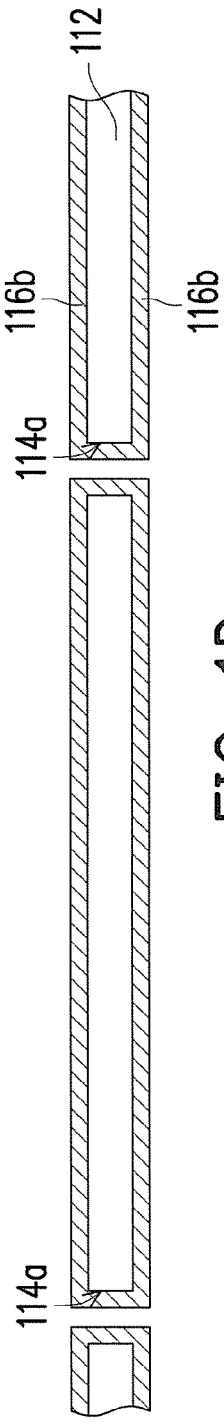
Figure 1E:
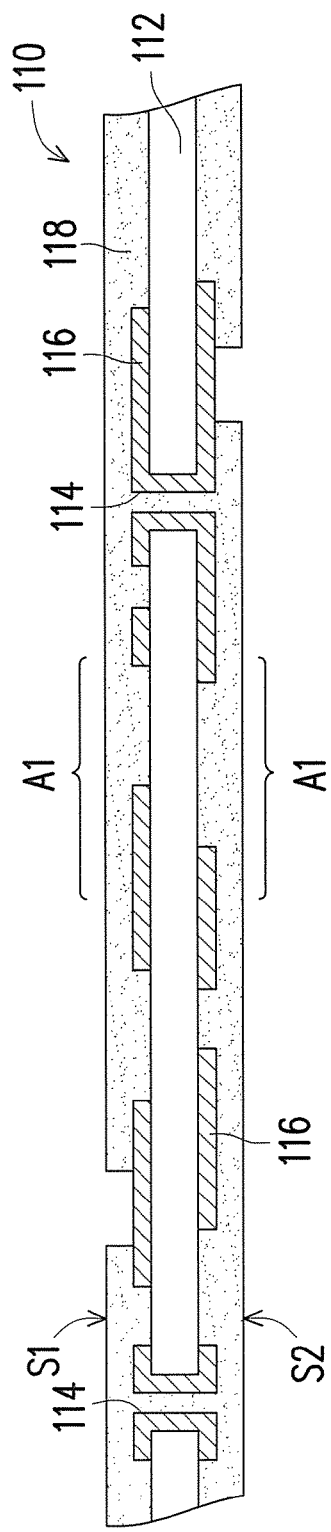

FIG. 1A to FIG. 1K are flow charts in cross-sectional view of a manufacturing method of a rigid-flex circuit board according to an embodiment of the present invention. A manufacturing method of a rigid-flex circuit board in the present embodiment includes the following steps. Firstly, referring to FIG. 1A to FIG. 1E, a flexible circuit board 110 shown in FIG. 1E is provided, wherein the flexible circuit board 110 includes a flexible substrate 112, a patterned metal layer 116, a plurality of exposed regions A1, a top surface S1 and a bottom surface S2 opposite to the top surface S1, and the exposed regions A1 are respectively located at the top surface S1 and the bottom surface S2 of the flexible circuit board 110 respectively. The patterned metal layer 116 is electrically connected to two opposite surfaces of the flexible substrate 112.

To be more specific, the step of providing the flexible circuit board 110 may include the following steps. Firstly, referring to FIG. 1A, the flexible substrate 112 described above is provided. Next, referring to FIG. 1B, a metal foil layer 116a is laminated on each of the two opposite surfaces of the flexible substrate 112. Then, referring to FIG. 1C, a plurality of first openings 114a are formed on the flexible substrate 112 and each of the first openings 114a shown in FIG. 1C connects the two opposite surfaces of the flexible substrate 112. Next, referring to FIG. 1D, an electroplating process is performed to form a metal plated layer 116b, wherein the metal plated layer 116b covers the two opposite surfaces of the flexible substrate 112 and inner walls of the first openings 114a. Then, an etching process is performed on the metal plated layer 116b to form a patterned metal layer 116 and a plurality of first conductive vias 114, wherein the patterned metal layer 116 is disposed on the two opposite surfaces of the flexible substrate 112. In the present embodiment, each of the first conductive vias 114 may be a plated through hole (PTH), a blind via hole (BVH) or buried via hole (BVH). The present invention does not limit the formation of the first conductive vias 114.

Moreover, in the present embodiment, a coverlay (CVL) 118 may further be formed on the flexible substrate 112 and the patterned metal layer 116 to cover the patterned metal layer 116 and protect the patterned metal layer 116 from oxidization or contaminated by external environment. In the present embodiment, the coverlay 118 may be formed by, for example, dispensing or dry film attaching, etc. The material of the coverlay 118 may include polymide and acrylic gel, etc., such that the coverlay 118 has both viscidity and flexibility. Certainly, the present embodiment is merely for illustration, and the present invention does not limit the material and the types of the coverlay 118.

Figure 1F:
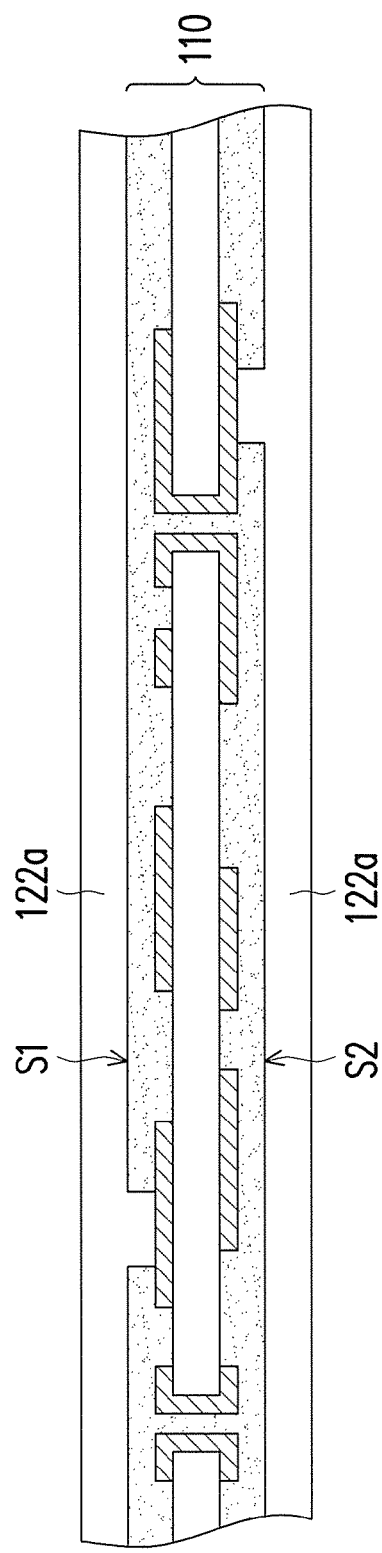
Figure 1G:
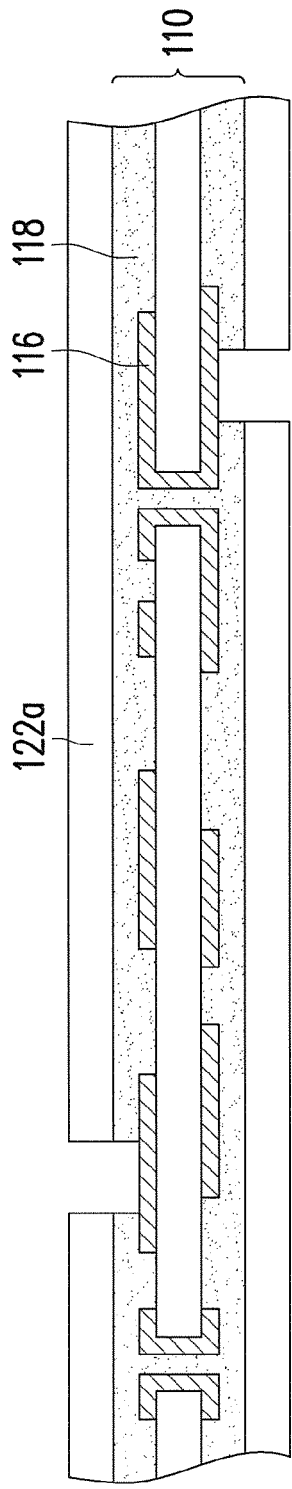
Figure 1H:
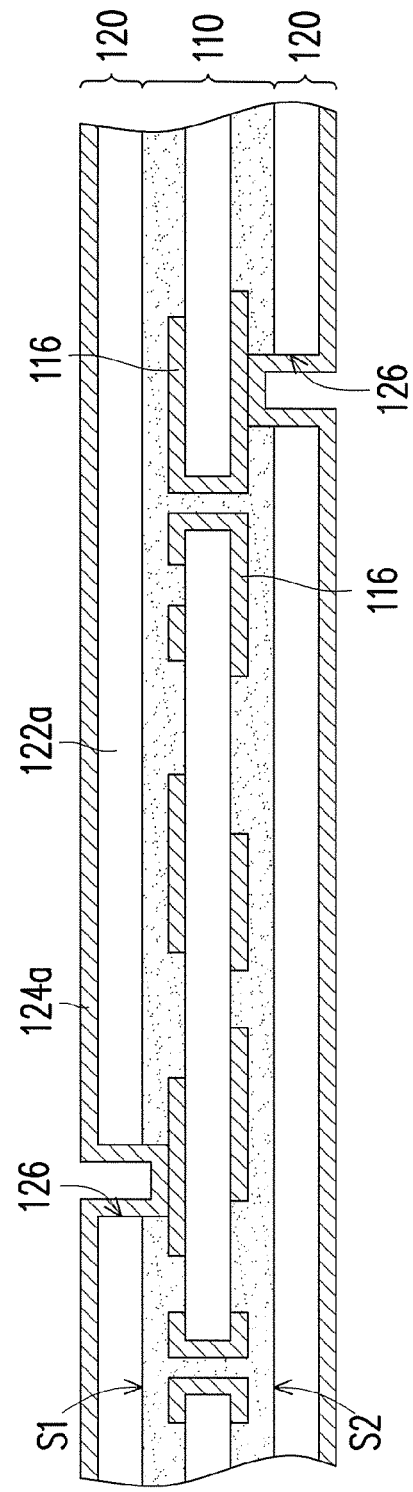

Referring to FIG. 1F to FIG. 1H, next, a stacking layer 120 is disposed on each of the top surface S1 and the bottom surface S2 of the flexible substrate 110 as shown in FIG. 1H, wherein each of the stacking layers 120 includes a photo-imageable substrate 122a and a metal layer 124a. Each of the photo-imageable substrates 122a is located between the flexible substrate 110 and the corresponding metal layer 124a, wherein each of the photo-imageable substrates 122a includes photo-sensitive material. In the present embodiment, the photo-imageable substrates 122a may be positive photoresists or negative photoresists. If the photo-imageable substrates 122a are negative photoresists, the photo-imageable substrates 122a would be cured and become insoluble to the photoresist developer after being exposed to light. On the contrary, if the photo-imageable substrates 122a are positive photoresists, the photo-imageable substrates 122a would be decomposed and become soluble to the photoresist developer after being exposed to light.

In detail, the method of forming the stacking layer 120 shown in FIG. 1H may include the following steps. Firstly, a photo-imageable substrate shown in FIG. 1F is disposed on each of the top surface S1 and the bottom surface S2 of the flexible substrate 110. Next, an opening photolithograph process is performed on each of the photo-imageable substrates 122a to form a plurality of second openings 126a on each of the photo-imageable substrates 122a as shown in FIG. 1G. Namely, the present embodiment adopts the characteristics of positive photoresist or negative photoresist of the photo-imageable substrates 122a to form the second openings 126a by photolithography. In addition, the coverlay 118 may have openings corresponding to the second openings 126a to expose the corresponding patterned metal layer 116 underneath. Next, an electroplating process is performed on the photo-imageable substrates 122a to form each of the metal layers 124a on each of the photo-imageable substrates 122a as shown in FIG. 1H, and the metal layers 124a covers inner walls of the second openings 126a to form a plurality of second conductive vias 126. As such, the second conductive vias 126 are electrically connected to the metal layers 124a and electrically connected to the patterned metal layer 116 of the flexible circuit board 110. In the present embodiment, the second conductive vias 126 may be plated through hole (PTH), blind via hole (BVH) or buried via hole (BVH). The present invention does not limit the formation of the second conductive vias 126.

Next, a patterning process is performed to the metal layers 124a as shown in FIG. 1H to form a plurality of patterned circuit layers 124 as shown in FIG. 1I. Moreover, the patterned circuit layers 124 expose the exposed region A1 respectively. In detail, the manufacturing process of the patterning process may include the following steps. Firstly, a patterned dry film layer is formed on each of the metal layers 124a, wherein the patterned dry film layers expose a part of the metal layers 124a. Next, an etching process is performed to remove the part of the metal layers 124a exposed by the patterned dry film layer to form the patterned circuit layers 124 shown in FIG. 1I. As such, the second conductive vias 126 are electrically connected to the patterned circuit layers 124 and the patterned metal layer 116 of the flexible circuit layer 110.

Figure 1K:
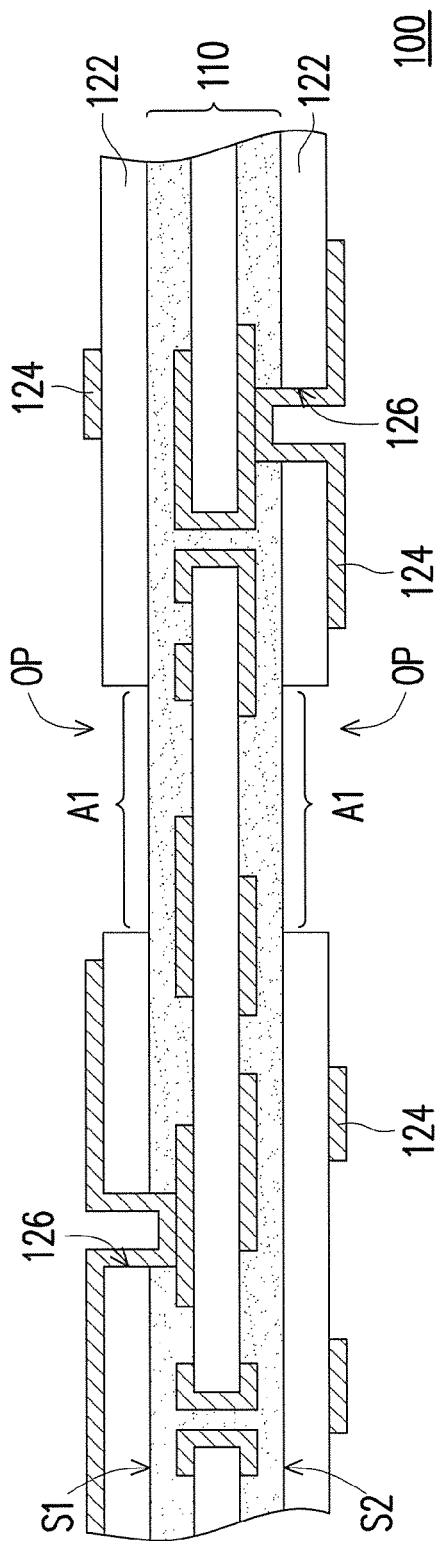

Next, a photolithography process as shown in FIG. 1J may be performed to the photo-imageable substrate 122a by utilizing the photo-imageable characteristics of the photo-imageable substrate 122a to form a plurality of patterned substrates 122 as shown in FIG. 1K, wherein each of the patterned substrates 122 includes an opening OP, and the openings OP expose the exposed regions A1 of the flexible circuit board 110. Accordingly, the manufacturing process of the rigid-flex circuit board 100 is substantially complete.

From *a* structural aspect, the rigid-flex circuit board 100 manufactured by the manufacturing method describe above includes a flexible circuit board 110, a plurality of patterned photo-imageable substrates 122 and a plurality of patterned circuit layers 124. The flexible circuit board 110 includes a plurality of exposed regions A1, a top surface S1 and a bottom surface S2 opposite to the top surface S1. The exposed regions A1 are respectively located at the top surface S1 and the bottom surface S2. The patterned photo-imageable substrates 122 are disposed on the top surface S1 and the bottom surface S2 respectively. Each of the patterned photo-imageable substrates 122 includes an opening OP. The openings OP expose the exposed regions A1 respectively, and each of the patterned photo-imageable substrates 122 includes photo-sensitive material. The patterned circuit layers 124 are disposed on the patterned photo-imageable substrates 122 respectively and expose the exposed regions A1.

In detail, in the present embodiment, the photo-imageable substrates 122a are negative photoresists. Namely, the photo-imageable substrates 122a are cured and become insoluble to the photoresist developer after being exposed to light. As such, the photolithography process may include the following steps. A patterned dry film 130 is formed on each of the photo-imageable substrates 122a as shown in FIG. 1J, wherein each of the patterned dry films 130 covers a removing region R1 of each of the photo-imageable substrates 122a. In the present embodiment, each of the removing regions R1 is an orthogonal-projection region where each of the exposed regions A1 is orthogonally projected on the corresponding photo-imageable substrate 122a. Then, an exposure process such as an ultraviolet light exposure process is performed, so as to expose a part of the photo-imageable substrates 122a, which is uncovered by the patterned dry films 130 under (ultraviolet) light. That is, the regions of the photo-imageable substrates 122a other than the removing regions R1 are exposed to the ultraviolet light and undergo a metamorphosis, such that the regions of the photo-imageable substrates 122a other than the removing regions R1 are cured to become insoluble to the photoresist developer. Next, a development process is performed, so as to remove the removing regions R1 covered by the patterned dry films 130 and unexposed to the ultraviolet light, such that the removing regions R1 is soluble to the photoresist developer. Thereby, the removing regions R1 covered by the patterned dry films 130 can be removed to form the patterned substrate 122 having the openings OP as shown in FIG. 1K.

Figure 2:
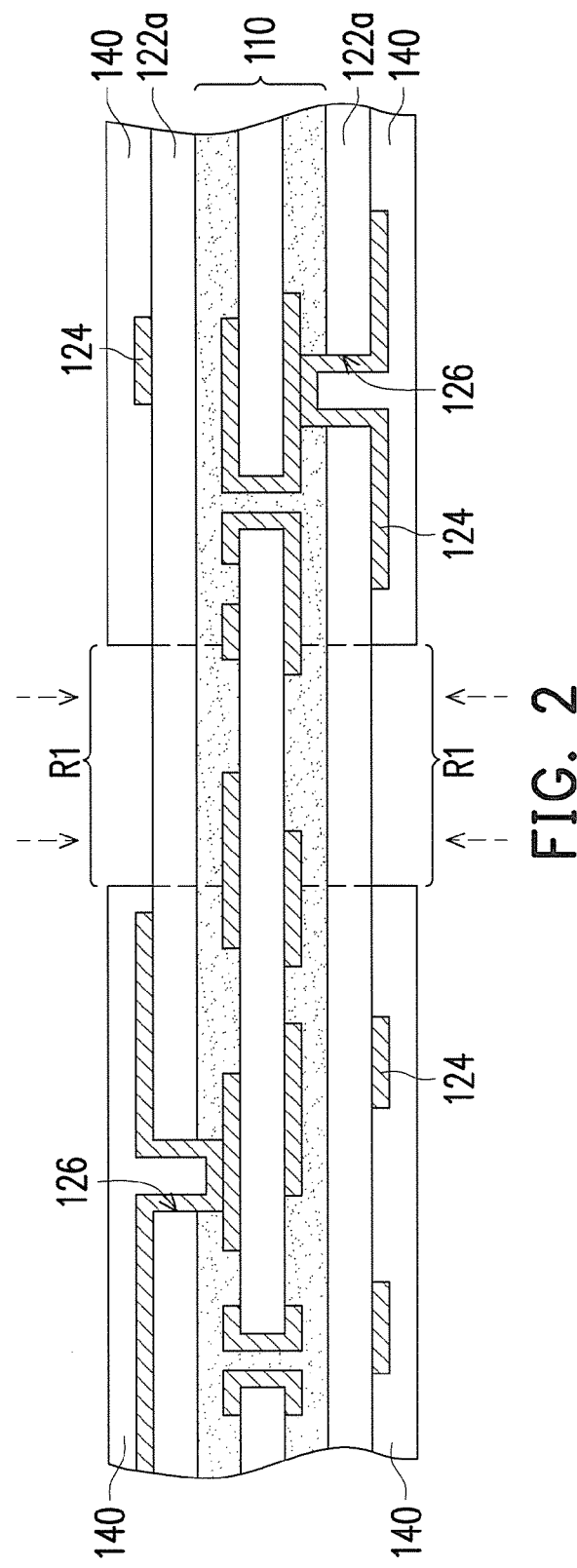
FIG. 2 is a part of the flow charts in cross-sectional view of a manufacturing method of a rigid-flex circuit board according to another embodiment of the present invention.

FIG. 2 is a part of the flow charts in cross-sectional view of a manufacturing method of a rigid-flex circuit board according to another embodiment of the present invention. It is noted that, in the present embodiment, the photo-imageable substrates 122a are positive photoresists. Namely, the photo-imageable substrates 122a are decomposed and become soluble to the photoresist developer after being exposed to light. As such, the photolithography process may include the following steps. A patterned dry film 140 is formed on each of the photo-imageable substrates 122a as shown in FIG. 2, wherein each of the patterned dry films 130 exposes a removing region R1 of each of the photo-imageable substrates 122a. Then, an exposure process such as an ultraviolet light exposure process is performed to expose the removing regions R1 of the photo-imageable substrates 122a under (ultraviolet) light. That is, the removing regions R1 of the photo-imageable substrates 122a are exposed to the ultraviolet light and undergo a metamorphosis, such that the removing regions R1 of the photo-imageable substrates 122a are decomposed to become soluble to the photoresist developer. Next, a development process is performed. Since the removing regions R1 are exposed under ultraviolet light to undergo a metamorphosis, the removing regions R1 become soluble to the photoresist developer in the development process, so as to remove the removing regions R1 exposed by the patterned dry films 140 to form the patterned substrate 122 having the openings OP as shown in FIG. 1K.

Figure 3C:
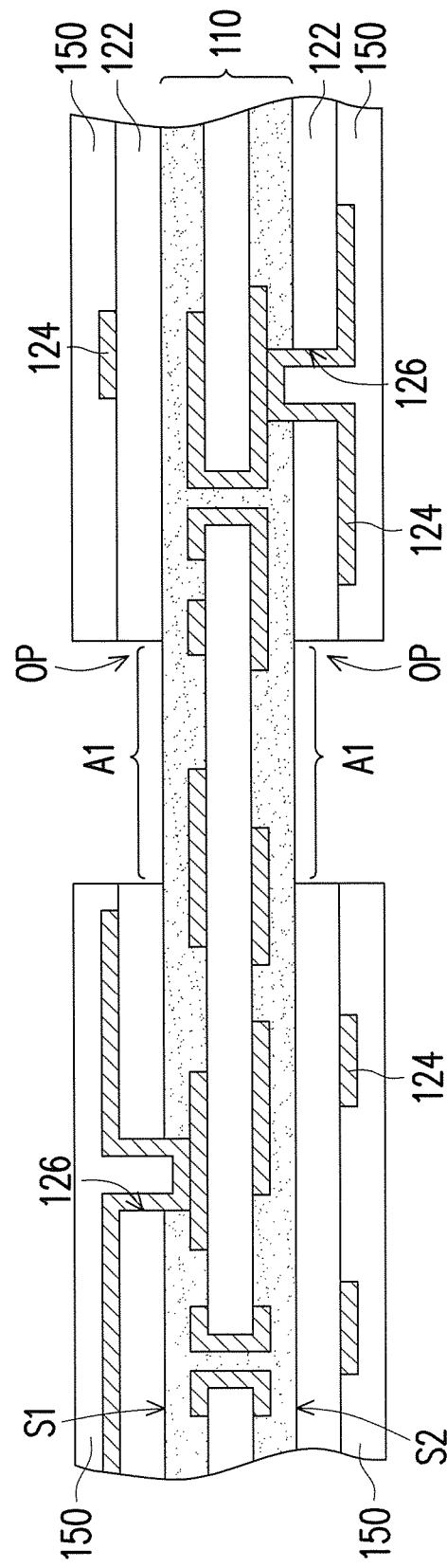

FIG. 3A to FIG. 3C are a part of the flow charts in cross-sectional view of a manufacturing method of a rigid-flex circuit board according to another embodiment of the present invention. The manufacturing process shown in FIG. 3A to FIG. 3C may be sequentially performed after the step shown in FIG. 1I. Namely, after the patterned circuit layers 124 shown in FIG. 1I are formed, a plurality of photo-imageable solder resist layers 150 are formed as shown in FIG. 3A, wherein the photo-imageable solder resist layers 150 cover the patterned circuit layers 124 and the photo-imageable substrates 122a. In the present embodiment, the photo-imageable solder resist layers 150 may be a liquid photo-imageable (LPI) solder resist layer. Moreover, the photo-imageable solder resist layers 150 and the photo-imageable substrates 122a are both positive photoresists. That is, the photo-imageable solder resist layers 150 and the photo-imageable substrates 122a both would be decomposed and become soluble to the photoresist developer after being exposed under light.

Next, a plurality of patterned dry films 160 are formed on the photo-imageable solder resist layers 150 as shown in FIG. 3B, and the patterned dry films 160 expose a plurality of removing regions R2 of the photo-imageable solder resist layers 150 and the photo-imageable substrates 122a. In the present embodiment, the removing regions R2 is an orthogonal-projection region where each of the exposed regions A1 is orthogonally projected on the corresponding photo-imageable substrate 122a and the corresponding photo-imageable solder resist layer 150. Next, an exposure process is performed to expose the photo-imageable solder resist layers 150 located in the exposed removing regions R2. As such, the photo-imageable solder resist layers 150 in the removing regions R2 are decomposed to become soluble to photoresist developer. Afterward, a development process is performed to remove the photo-imageable solder resist layers 150 in the removing regions R2 exposed by the patterned dry films 160 to form a plurality of patterned photo-imageable solder resist layers 150 as shown in FIG. 3C. Next, the exposure and development process described above are repeated, so as to perform the exposure and development process to the photo-imageable substrates 122a in the removing regions R2 exposed by the patterned dry films 160 and the photo-imageable solder resist layers 150 to remove the photo-imageable substrates 122a in the removing regions R2 and for the patterned substrates 122 having openings OP as shown in FIG. 3C. Accordingly, each of the photo-imageable solder resist layers 150 includes a solder resist opening as shown in FIG. 3C, and an inner wall of each of the solder resist openings is aligned with an inner wall of each of the openings OP.

In addition, in the present embodiment, the manufacturing method of the rigid-flex circuit board may further include the step of forming a plurality of alignment holes on the stacking layers 120, and the alignment holes are located on a periphery of the stacking layers 120 to be used as alignment marks for the stacking of the rigid-flex circuit board 100. Moreover, in the present embodiment, the rigid-flex circuit board 100 merely shows two stacking layers 120 on the top and the bottom thereof respectively. However, in other embodiments, a plurality of stacking layers may further be stacked on two opposite sides of the rigid-flex circuit board 100, and the alignment holes may be used for alignment between the plurality of stacking layers.

In sum, in the present invention, the manufacturing method of the rigid-flex circuit board firstly employs the photo-imageable substrate to cover the flexible circuit board; then, a photolithography process is performed on a removing region of the photo-imageable substrates by utilizing the photo-imageable characteristics of the photo-imageable substrates to remove the removing region and expose the flexible circuit board underneath, so as to form the structure of the rigid-flex circuit board easily. Therefore, the present invention improves the manufacturing efficiency of the rigid-flex circuit board. Moreover, the manufacturing method of the rigid-flex circuit board provided by the present invention can avoid the damage to the flexible circuit board caused by scraps produced from conventional manufacturing process, and further avoids the problems of gel overflow and misalignment during lamination process. Therefore, the present invention can improve yield rate of manufacturing process of the rigid-flex circuit board.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A rigid-flex circuit board, comprising:
   a flexible circuit board comprising a plurality of exposed regions, a top surface and a bottom surface opposite to the top surface, wherein the exposed regions are respectively located at the top surface and the bottom surface;
   a plurality of patterned photo-imageable substrates disposed on the top surface and the bottom surface of the flexible circuit board respectively, wherein each of the patterned photo-imageable substrates comprises an opening, the openings expose the exposed regions respectively, and material of each of the patterned photo-imageable substrates comprises photo-sensitive material; and
   a plurality of patterned circuit layers disposed on the patterned photo-imageable substrates respectively and exposed the exposed regions.

2. The rigid-flex circuit board as claimed in claim 1, wherein the flexible circuit board comprises a flexible substrate and a patterned metal layer, and the patterned metal layer is disposed on two opposite surfaces of the flexible substrate.

3. The rigid-flex circuit board as claimed in claim 2, wherein the flexible circuit board further comprises a plurality of first conductive vias disposed on the flexible substrate, the first conductive vias are electrically connected to the patterned metal layer and electrically connected to the two opposite surfaces of the flexible substrate.

4. The rigid-flex circuit board as claimed in claim 3, wherein each of the first conductive vias comprises a plated through hole, a blind via hole or a buried via hole.

5. The rigid-flex circuit board as claimed in claim 2, wherein each of the patterned photo-imageable substrates further comprises a plurality of second conductive vias, and the second conductive vias are electrically connected to the patterned circuit layer and the patterned metal layer.

6. The rigid-flex circuit board as claimed in claim 5, wherein each of the second conductive vias comprises a plated through hole, a blind via hole or a buried via hole.

7. The rigid-flex circuit board as claimed in claim 2, wherein the flexible circuit layer further comprises a coverlay covering the flexible substrate and the patterned metal layer.

8. The rigid-flex circuit board as claimed in claim 1, further comprising a plurality of photo-imageable solder resist layers disposed on the corresponding patterned circuit layers and the corresponding patterned photo-imageable substrates, wherein each of the photo-imageable solder resist layers comprises a solder resist opening, and an inner wall of each of the solder resist openings is aligned with an inner wall of each of the openings.

9. The rigid-flex circuit board as claimed in claim 8, wherein each of the photo-imageable solder resist layers comprises a liquid photo-imageable (LPI) solder resist layer.

10. The rigid-flex circuit board as claimed in claim 1, further comprising a plurality of alignment holes disposed on a periphery of each of the patterned photo-imageable substrates.

11. A manufacturing method of a rigid-flex circuit board, comprising:
    providing a flexible circuit board, wherein the flexible circuit board comprises a plurality of exposed regions, a top surface and a bottom surface opposite to the top surface, and the exposed regions are respectively located at the top surface and the bottom surface;
    disposing a stacking layer on each of the top surface and the bottom surface of the flexible substrate, wherein each of the stacking layers comprises a photo-imageable substrate and a metal layer, each of the photo-imageable substrates is located between the flexible substrate and the corresponding metal layer, and each of the photo-imageable substrate comprises photo-sensitive material;
    performing a patterning process to the metal layers to form a plurality of patterned circuit layers, and the patterned circuit layers expose the exposed regions respectively; and
    performing a photolithography process to the photo-imageable substrates to form a plurality of patterned substrates, each of the patterned substrates comprises an opening, and the openings expose the exposed regions respectively.

12. The manufacturing method of a rigid-flex circuit board as claimed in claim 11, wherein the flexible circuit board comprises a flexible substrate and a patterned metal layer, and the patterned metal layer is electrically connected to two opposite surfaces of the flexible substrate.

13. The manufacturing method of a rigid-flex circuit board as claimed in claim 12, wherein the step of providing the flexible circuit layer comprises:
    providing a flexible substrate;
    laminating a metal foil layer on each of the two opposite surfaces of the flexible substrate; and
    forming a plurality of first openings on the flexible substrate, wherein each of the first openings connects the two opposite surfaces of the flexible substrate;
    performing an electroplating process to form a metal plated layer, wherein the metal plated layer covers the two opposite surfaces of the flexible substrate and inner walls of the first openings to form a plurality of first conductive vias; and
    performing an etching process to the metal plated layer to from the patterned metal layer.

14. The manufacturing method of a rigid-flex circuit board as claimed in claim 13, wherein each of the first conductive vias comprises a plated through hole, a blind via hole or a buried via hole.

15. The manufacturing method of a rigid-flex circuit board as claimed in claim 11, wherein the patterning process comprises:
    forming a patterned dry film on each of the metal layers, wherein each of the patterned dry films partially exposes each of the metal layers; and
    performing an etching process to remove a part of the metal layers exposed by the patterned fry films to form the patterned circuit layers.

16. The manufacturing method of a rigid-flex circuit board as claimed in claim 11, wherein the photolithography process comprises:
    forming a patterned dry film on each of the photo-imageable substrates, wherein each of the patterned dry films covers a removing region of each of the photo-imageable substrates, and each of the removing regions is an orthogonal-projection region where each of the exposed regions is orthogonally projected on the corresponding photo-imageable substrate;

performing an exposure process, so as to expose a part of the photo-imageable substrates uncovered by the patterned dry films under light; and performing a development process, so as to remove the removing regions covered by the patterned dry films to form the patterned substrate having the openings.

17. The manufacturing method of a rigid-flex circuit board as claimed in claim 11, wherein the photolithography process comprises:

performing an exposure process to a removing region of each of the photo-imageable substrate, wherein each of the removing regions is an orthogonal-projection region where each of the exposed regions is orthogonally projected on the corresponding photo-imageable substrate; and performing a development process, so as to remove the removing regions to from the patterned substrate having the openings.

18. The manufacturing method of a rigid-flex circuit board as claimed in claim 11, further comprising:

forming a plurality of photo-imageable solder resist layers, the photo-imageable solder resist layers cover the patterned circuit layers and the photo-imageable substrates;

performing an exposure process to a plurality of removing regions of the photo-imageable substrates and the photo-imageable solder resist layers, wherein each of the removing regions is an orthogonal-projection region where each of the exposed regions is orthogonally projected on the corresponding photo-imageable substrate and the corresponding photo-imageable solder resist layer; and performing a development process, so as to remove the removing regions to form a plurality of patterned photo-imageable solder resist layers and the patterned substrates.

19. The manufacturing method of a rigid-flex circuit board as claimed in claim 11, wherein a method for manufacturing the stacking layer comprises:

performing an opening photolithograph process on each of the photo-imageable substrates to form a plurality of second openings on each of the photo-imageable substrates; and performing an electroplating process to form the metal layers on the photo-imageable substrates, and the metal layers covers inner walls of the second openings to form a plurality of second conductive vias.

20. The manufacturing method of a rigid-flex circuit board as claimed in claim 19, wherein each of the second conductive vias comprises a plated through hole, a blind via hole or a buried via hole.

21. The manufacturing method of a rigid-flex circuit board as claimed in claim 11, further comprising:

forming a plurality of alignment holes on the stacking layers, wherein the alignment holes are located on a periphery of the stacking layers.

* * * * *